United States Patent
Eguchi et al.

(10) Patent No.: US 9,018,956 B2
(45) Date of Patent: Apr. 28, 2015

(54) APPARATUS AND METHOD FOR DIAGNOSING ABNORMALITY IN CELL BALANCING CIRCUIT

(71) Applicant: LG Chem, Ltd., Seoul (KR)

(72) Inventors: Yasuhito Eguchi, Daejeon (KR); Shoji Tanina, Daejeon (KR); Ju-Hyun Kang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/287,972

(22) Filed: May 27, 2014

(65) Prior Publication Data

US 2014/0253135 A1    Sep. 11, 2014

Related U.S. Application Data

(63) Continuation of application No. PCT/KR2014/000719, filed on Jan. 24, 2014.

(30) Foreign Application Priority Data

Feb. 19, 2013   (KR) ........................ 10-2013-0017669

(51) Int. Cl.
*G01R 31/36* (2006.01)
*H02J 7/00* (2006.01)
*G01R 35/00* (2006.01)
*G01R 31/02* (2006.01)

(52) U.S. Cl.
CPC ............ *G01R 31/3627* (2013.01); *G01R 35/00* (2013.01); *G01R 31/02* (2013.01)

(58) Field of Classification Search
CPC ................... G01R 31/3627; G01R 31/3658
USPC .......................................... 324/434; 320/116
See application file for complete search history.

(56) References Cited

U.S. PATENT DOCUMENTS

| | | | | |
|---|---|---|---|---|
| 6,121,751 | A * | 9/2000 | Merritt | 320/116 |
| 8,643,500 | B2 * | 2/2014 | Lee et al. | 340/636.1 |
| 8,648,602 | B2 * | 2/2014 | van Lammeren | 324/430 |
| 2010/0090653 | A1 | 4/2010 | Kuwano et al. | |
| 2011/0285538 | A1 * | 11/2011 | Lee et al. | 340/636.1 |
| 2012/0098547 | A1 | 4/2012 | Inoue | |

(Continued)

FOREIGN PATENT DOCUMENTS

| | | |
|---|---|---|
| JP | 2002-168928 A | 6/2002 |
| KR | 10-2010-0023364 A | 3/2010 |

(Continued)

*Primary Examiner* — M'Baye Diao
(74) *Attorney, Agent, or Firm* — Birch, Stewart, Kolasch & Birch, LLP (57) ABSTRACT

Disclosed is an apparatus and method for diagnosing an abnormality in a cell balancing circuit in a battery pack including a plurality of cells corresponding to each cell balancing circuit. The present disclosure turns off cell balancing switches included in a cell balancing circuit to be diagnosed and an adjacent cell balancing circuit among the cell balancing circuits. Also, the present disclosure stores a voltage value between nodes of the cell (hereinafter referred to as a 'diagnosis voltage value') by turning on the cell balancing switch of the cell balancing circuit to be diagnosed. Also, the present disclosure calculates a difference value between adjacent cell voltage values (hereinafter referred to as a 'cell difference value') and a difference value between adjacent diagnosis voltage values (hereinafter referred to as a 'diagnosis difference value').

19 Claims, 9 Drawing Sheets

(56) References Cited

U.S. PATENT DOCUMENTS

2013/0297237 A1* 11/2013 Ramos et al. .................. 702/59
2013/0335095 A1* 12/2013 Kiuchi, Hideki ............. 324/426
2014/0055896 A1* 2/2014 Muramoto et al. ............ 361/86

FOREIGN PATENT DOCUMENTS

| KR | 10-2010-0028807 A | 3/2010 |
| KR | 10-2011-0100863 | 9/2011 |

* cited by examiner

| | | $V_{cell}$=3.5V | $V_{cell}$=3.5V | | $V_{cell}$=3.5V | |
|---|---|---|---|---|---|---|
| | | CELL VOLTAGE VALUE | DIAGNOSIS VOLTAGE VALUE (ODD) | CELL VOLTAGE VALUE- DIAGNOSIS VOLTAGE VALUE(ODD) | DIAGNOSIS VOLTAGE VALUE (EVEN) | CELL VOLTAGE VALUE- DIAGNOSIS VOLTAGE VALUE(EVEN) |
| EVEN | V6 | 3.5 | 3.6 | -0.1 | 3.3 | 0.2 |
| ODD | V5 | 3.5 | 3.3 | 0.2 | 3.7 | -0.2 |
| EVEN | V4 | 3.5 | 3.7 | -0.2 | 3.3 | 0.2 |
| ODD | V3 | 3.5 | 3.3 | 0.2 | 3.7 | -0.2 |
| EVEN | V2 | 3.5 | 3.7 | -0.2 | 3.3 | 0.2 |
| ODD | V1 | 3.5 | 3.3 | 0.2 | 3.6 | -0.1 |

FIG. 5

| | | CELL VOLTAGE VALUE $V_{cell}=3.5V$ | DIAGNOSIS VOLTAGE VALUE (ODD) $V_{cell}=3.5V$ | CELL VOLTAGE VALUE- DIAGNOSIS VOLTAGE (ODD) | DIAGNOSIS VOLTAGE VALUE (EVEN) $V_{cell}=3.5V$ | CELL VOLTAGE VALUE- DIAGNOSIS VOLTAGE (EVEN) |
|---|---|---|---|---|---|---|
| EVEN | V6 | 3.5 | 3.6 | −0.1 | 3.3 | 0.2 |
| ODD | V5 | 3.5 | 3.3 | 0.2 | 3.7 | −0.2 |
| EVEN | V4 | 3.5 | 3.7 | −0.2 | 3.3 | 0.2 |
| ODD | V3 | 3.5 | 0.5 | 3.0 | 6.6 | −3.1 |
| EVEN | V2 | 3.5 | 6.6 | −3.1 | 0.5 | 3.0 |
| ODD | V1 | 3.5 | 3.3 | 0.2 | 3.5 | 0 |

↑ SHORT-CIRCUITED L2

FIG. 6

| | | Vcell=3.5V<br>CELL VOLTAGE VALUE | Vcell=3.3V<br>DIAGNOSIS VOLTAGE VALUE (ODD) | CELL VOLTAGE VALUE -<br>DIAGNOSIS VOLTAGE VALUE(ODD) | Vcell=3.7V<br>DIAGNOSIS VOLTAGE VALUE (EVEN) | CELL VOLTAGE VALUE -<br>DIAGNOSIS VOLTAGE VALUE(EVEN) |
|---|---|---|---|---|---|---|
| EVEN | V6 | 3.5 | 3.4 | 0.1 | 3.49 | 0.01 |
| ODD | V5 | 3.5 | 3.11 | 0.39 | 3.91 | -0.41 |
| EVEN | V4 | 3.5 | 3.39 | 0.11 | 3.49 | 0.01 |
| ODD | V3 | 3.5 | 3.3 | 0.2 | 3.91 | -0.41 |
| EVEN | V2 | 3.5 | 3.39 | 0.11 | 3.49 | 0.01 |
| ODD | V1 | 3.5 | 3.11 | 0.39 | 3.81 | -0.31 |

↑
SHORT-CIRCUITED L2

FIG. 7

| | | CELL VOLTAGE VALUE $V_{cell}=3.5V$ | CELL DIFFERENCE VALUE | DIAGNOSIS VOLTAGE VALUE (ODD) $V_{cell}=3.3V$ | DIAGNOSIS DIFFERENCE VALUE (ODD) | DETERMINATION VALUE (ODD) | DIAGNOSIS VOLTAGE VALUE (EVEN) $V_{cell}=3.7V$ | DIAGNOSIS DIFFERENCE VALUE (EVEN) | DETERMINATION VALUE (EVEN) |
|---|---|---|---|---|---|---|---|---|---|
| EVEN | V6 | 3.5 | 0 | 3.39 | | | 3.49 | 0.43 | 0.43 |
| ODD | V5 | 3.5 | 0 | 3.11 | 0.28 | 0.28 | 3.91 | 0.43 | 0.43 |
| EVEN | V4 | 3.5 | 0 | 3.49 | 0.37 | | 3.49 | 0.43 | 0.43 |
| ODD | V3 | 3.5 | 0 | 3.11 | 0.37 | 0.37 | 3.91 | 0.43 | 0.43 |
| EVEN | V2 | 3.5 | 0 | 3.49 | 0.37 | | 3.49 | 0.32 | 0.32 |
| ODD | V1 | 3.5 | 0 | 3.11 | 0.37 | 0.37 | 3.81 | | |

FIG. 8

| | | $V_{cell}$=VARIOUS | | $V_{cell}$=(-0.2V) | | | $V_{cell}$=(+0.2V) | | |
|---|---|---|---|---|---|---|---|---|---|
| | | CELL VOLTAGE VALUE | CELL DIFFERENCE VALUE | DIAGNOSIS VOLTAGE VALUE (ODD) | DIAGNOSIS DIFFERENCE VALUE (ODD) | DETERMINATION VALUE (ODD) | DIAGNOSIS VOLTAGE VALUE (EVEN) | DIAGNOSIS DIFFERENCE VALUE (EVEN) | DETERMINATION VALUE (EVEN) |
| EVEN | V6 | 3.5 | 0.2 | 3.39 | 0.46 | 0.26 | 3.49 | -0.23 | 0.43 |
| ODD | V5 | 3.3 | -0.4 | 2.93 | -0.75 | 0.35 | 3.721 | 0.05 | 0.45 |
| EVEN | V4 | 3.7 | 0.2 | 3.68 | 0.57 | 0.37 | 3.63 | -0.26 | 0.46 |
| ODD | V3 | 3.5 | -0.3 | 3.11 | -0.66 | 0.36 | 3.93 | 0.16 | 0.46 |
| EVEN | V2 | 3.8 | 0.6 | 3.78 | 0.94 | 0.34 | 3.77 | 0.25 | 0.35 |
| ODD | V1 | 3.2 | | 2.83 | | | 3.52 | | |

FIG. 9

| | | $V_{cell}$=VARIOUS | | $V_{cell}$=(-0.2V) | | | $V_{cell}$=(+0.2V) | | |
|---|---|---|---|---|---|---|---|---|---|
| | | CELL VOLTAGE VALUE | CELL DIFFERENCE VALUE | DIAGNOSIS VOLTAGE VALUE (ODD) | DIAGNOSIS DIFFERENCE VALUE (ODD) | DETERMINATION VALUE (ODD) | DIAGNOSIS VOLTAGE VALUE (EVEN) | DIAGNOSIS DIFFERENCE VALUE (EVEN) | DETERMINATION VALUE (EVEN) |
| EVEN | V6 | 3.5 | | 3.39 | | | 3.49 | -0.23 | 0.43 |
| ODD | V5 | 3.3 | 0.2 | 2.93 | 0.46 | 0.26 | 3.721 | 0.05 | 0.45 |
| EVEN | V4 | 3.7 | -0.4 | 3.68 | -0.66 | 0.26 | 3.63 | -0.26 | 0.46 |
| ODD | V3 | 3.5 | 0.2 | 3.3 | 0.29 | 0.09 | 3.93 | 0.16 | 0.46 |
| EVEN | V2 | 3.8 | -0.3 | 3.78 | -0.38 | 0.08 | 3.77 | 0.25 | 0.35 |
| ODD | V1 | 3.2 | 0.6 | 2.83 | 0.85 | 0.26 | 3.52 | | |

SHORT-CIRCUITED L2

APPARATUS AND METHOD FOR DIAGNOSING ABNORMALITY IN CELL BALANCING CIRCUIT

CROSS REFERENCE TO RELATED APPLICATIONS

This application is a Continuation Application of PCT/KR2014/000719 filed on Jan. 24, 2014, which claims priority to Korean Patent Application No. 10-2013-0017669 filed in Republic of Korea on Feb. 19, 2013, the entire contents of which are expressly incorporated herein by reference into the present application.

TECHNICAL FIELD

The present disclosure relates to an apparatus and a method for diagnosing an abnormality in a cell balancing circuit, and more particularly, to an apparatus and a method for diagnosing an abnormality in a cell balancing circuit that may diagnose whether an abnormality or a wiring short occurs to a cell balancing switch in the cell balancing circuit using a discharge resistor, which switches a flow of discharging current to the side of the discharge resistor.

BACKGROUND ART

Recently, with exhaustion of fossil fuels and concern about environmental pollution, there is an increasing interest in electric vehicles or hybrid vehicles using electrical energy, but not using fossil energy, and in this context, studies are actively being conducted thereon. To supply power required to operate a driving motor for driving of vehicles and actuate various electric devices, a battery pack including a plurality of secondary battery cells is mounted in electric vehicles or hybrid vehicles. The plurality of secondary battery cells included in the battery pack need to uniformly maintain the voltage of each secondary battery cell to ensure stability, a long life span, and a high output.

As a method for uniformly balancing the charging voltage of each secondary battery cell included in a battery pack, many methods are being used, for example, a method that increases the voltage of a secondary battery cell having a relatively lower voltage by supplying a charging current to the corresponding secondary battery cell, a method that decreases the voltage of a secondary battery cell having a relatively higher voltage by discharging the corresponding secondary battery cell, a method that sets a target balancing voltage from the voltage of each secondary battery cell, discharges a secondary battery cell having a voltage higher than the target voltage, and charges a secondary battery cell having a voltage lower than the target voltage, and the like.

These cell balancing methods are implemented by a cell balancing circuit connected to each secondary battery cell. The cell balancing circuit includes a switching element for controlling the start and end of a cell balancing operation, and a discharge resistor used when discharging the secondary battery cell voltage.

However, when an abnormal situation occurs while a cell balancing operation is performed using a cell balancing circuit, for example, when overcurrent instantaneously flows in the cell balancing circuit, or when overvoltage higher than an operating voltage is applied to a switching element, or when overheat is generated through a discharge resistor, a component included in the cell balancing circuit is short-circuited or open-circuited, and consequently, the circuit does not operate normally.

When the cell balancing circuit fails to operate normally, voltage of a secondary battery cell connected to the corresponding circuit excessively increases or decreases in comparison to the other secondary batteries, and as a result, severe results may be produced, for example, operation of a load connected to a battery pack may suddenly stop, or in more serious cases, the battery pack may explode.

To overcome this drawback, there is a need for a diagnosis circuit connected to a cell balancing circuit to diagnose an abnormality in the cell balancing circuit. For example, Japanese Patent Publication No. 2007-085847 discloses an apparatus for detecting an abnormality in a cell balancing circuit, in which a cell balancing circuit including a field effect transistor (FET) and a discharge resistor and a resistor interposed between a source and a drain of the FET are installed at each battery cell, a voltage difference between the source and the drain is measured through the resistor using two comparators to which different levels of reference voltage sources are applied, and whether there is an abnormality in the cell balancing circuit is determined based on a combination of the measured voltage levels (high, low).

However, the above related art needs a separate circuit configuration, that is, the diagnosis circuit to detect an abnormality in the cell balancing circuit, and uses the additional two comparators for each diagnosis circuit, and thus, has a disadvantage of increased manufacturing cost of the apparatus for detecting an abnormality in a cell balancing circuit. Also, the related art can determine whether an abnormality is present in a cell balancing circuit corresponding to each cell, but when an abnormality occurs in all the cell balancing circuits included in the entire cell balancing circuit due to a short or disconnection, the circuit configuration of the related art is inadequate to identify a correct cause of the abnormality in the cell balancing circuit.

DISCLOSURE

Technical Problem

The present disclosure is designed to solve the problems of the related art, and therefore, the present disclosure is directed to providing an apparatus and method for diagnosing an abnormality in a cell balancing circuit more correctly.

Technical Solution

To achieve the object, an apparatus for diagnosing an abnormality in a cell balancing circuit according to the present invention diagnoses an abnormality in a cell balancing circuit in a battery pack including a plurality of cells corresponding to each cell balancing circuit, and includes a cell balancing circuit connected in parallel to a voltage sensing line connected to both terminals of each cell and including a cell balancing switch and a discharge resistor, a diagnosis resistor installed on the voltage sensing line at the side of the cell with respect to a node (a high potential node and a low potential node) at which the cell balancing circuit and the cell voltage sensing line are connected, a voltage sensing circuit to output a voltage corresponding to a voltage difference between the high potential node and the low potential node (hereinafter referred to as an 'inter-node voltage value'), and a control unit to store an inter-node voltage value (hereinafter referred to as a 'cell voltage value') in a turn-off state of the cell balancing switches and an inter-node voltage value (hereinafter referred to as a 'diagnosis voltage value') by turning on a cell balancing switch of a cell balancing circuit to be diagnosed among the cell balancing circuits in a turn-off state of a cell balancing switch included in a cell balancing circuit adjacent to the cell balancing circuit to be diagnosed, to calculate a difference value between adjacent cell voltage values (hereinafter referred to as a 'cell difference value') and a difference value between adjacent diagnosis voltage values (hereinafter referred to as a 'diagnosis difference value'), and to determine whether an abnormality is present in the cell balancing circuit by analyzing a change pattern of a difference value between the cell difference value and the diagnosis difference value (hereinafter referred to as a 'determination value').

The apparatus for diagnosing an abnormality in a cell balancing circuit according to the present disclosure may further include a diode connected to the discharge resistor in series between the high potential node and the low potential node on the cell balancing circuit to limit the application of voltage in reverse direction.

According to one embodiment of the present disclosure, the cell balancing switch is a field effect transistor (FET).

The control unit according to the present disclosure classifies the cell balancing circuits into at least two groups according to a location at which each cell is connected within the battery pack. For example, the control unit may divide into an odd group and an even group according to a location at which each cell is connected from the low potential terminal of the battery pack.

According to one embodiment of the present disclosure, the control unit may calculate an absolute value of the determination value, and determine that an abnormality is present in a cell balancing circuit corresponding to a determination value of which a level reduces, by comparing to an adjacent determination value.

According to another embodiment of the present disclosure, the control unit may calculate an absolute value of the determination value, and determine that an abnormality is present in a cell balancing circuit corresponding to a change amount greater than a preset reference change value, by comparing to an adjacent determination value. To do so, the apparatus for diagnosing an abnormality in a cell balancing circuit according to the present disclosure may further include a memory unit to store the reference change value.

The apparatus for diagnosing an abnormality in a cell balancing circuit according to the present disclosure may further include an abnormality alarm to notify, when an abnormality occurs in the cell balancing circuit, the occurrence of the abnormality to an external. In this instance, the control unit notifies the occurrence of the abnormality in the cell balancing circuit visually or audibly through the abnormality alarm.

The apparatus for diagnosing an abnormality in a cell balancing circuit according to the present disclosure may be one component of a battery pack including an apparatus for diagnosing an abnormality in a cell balancing circuit and a plurality of secondary battery cells connected in series.

The battery pack according to the present disclosure may be one component of a battery operating system including a battery pack and a load that is supplied with power from the battery pack. In this instance, the load may be an electricity-powered means or a portable device.

To achieve the object, a method for diagnosing an abnormality in a cell balancing circuit according to the present disclosure diagnoses an abnormality in a cell balancing circuit in a battery pack including a plurality of cells using a cell balancing circuit connected in parallel to a voltage sensing line connected to both terminals of each cell and including a cell balancing switch and a discharge resistor corresponding to each cell, a diagnosis resistor installed on the voltage sensing line at the side of the cell with respect to a node (a high potential node and a low potential node) at which the cell balancing circuit and the cell voltage sensing line are connected, and a voltage sensing circuit to output a voltage corresponding to a voltage difference between the nodes of the cell, and includes (a) sensing a voltage value between the nodes of the cell balancing circuit through the voltage sensing circuit in a turn-off state of the cell balancing switches by controlling the cell balancing switches, (b) sensing a voltage value between the nodes of the cell (hereinafter referred to as a 'diagnosis voltage value') by turning on a cell balancing switch of a cell balancing circuit to be diagnosed among the cell balancing circuits in a turn-off state of a cell balancing switch included in a cell balancing circuit adjacent to the cell balancing circuit to be diagnosed, and (c) calculating a difference value between adjacent cell voltage values (hereinafter referred to as a 'cell difference value') and a difference value between adjacent diagnosis voltage values (hereinafter referred to as a 'diagnosis difference value'), and determining whether an abnormality is present in the cell balancing circuit by analyzing a change pattern of a difference value between the cell difference value and the diagnosis difference value (hereinafter referred to as a 'determination value').

According to one embodiment of the present disclosure, in the step (b), the circuits to be diagnosed are classified into at least two groups according to a location at which each cell is connected within the battery pack. For example, in the step (b), the circuits to be diagnosed may be divided into an odd group and an even group according to a location at which each cell is connected from the low potential terminal of the battery pack.

According to one embodiment of the present disclosure, the step (c) includes calculating an absolute value of the determination value, and determining that an abnormality is present in a cell balancing circuit corresponding to a determination value of which a level reduces, by comparing to an adjacent determination value.

According to another embodiment of the present disclosure, the step (c) may include calculating an absolute value of the determination value, and determining that an abnormality is present in a cell balancing circuit corresponding to a change amount greater than a preset reference change value, by comparing to an adjacent determination value. To do so, the method for diagnosing an abnormality in a cell balancing circuit according to the present disclosure may further include, before the step (a), storing the reference change value.

The method for diagnosing an abnormality in a cell balancing circuit according to the present disclosure may further include (d) notifying, when an abnormality occurs in the cell balancing circuit, the occurrence of the abnormality visually or audibly to an external.

Advantageous Effects

An apparatus and method for diagnosing an abnormality in a cell balancing circuit according to the present disclosure may determine whether an abnormality has occurred more correctly than a conventional abnormality diagnosis apparatus and method. Particularly, when controlling a cell balancing switch, a little time difference may occur. In this case, a voltage change may occur in a cell included in a battery pack, and despite this change, whether an abnormality has occurred may be determined correctly through a difference value of a diagnosis value, and a determination value.

DESCRIPTION OF DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawings.

MODE FOR INVENTION

Hereinafter, the present invention will be described in detail with reference to the accompanying drawings. Prior to the description, it should be understood that the terms used in the specification and appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
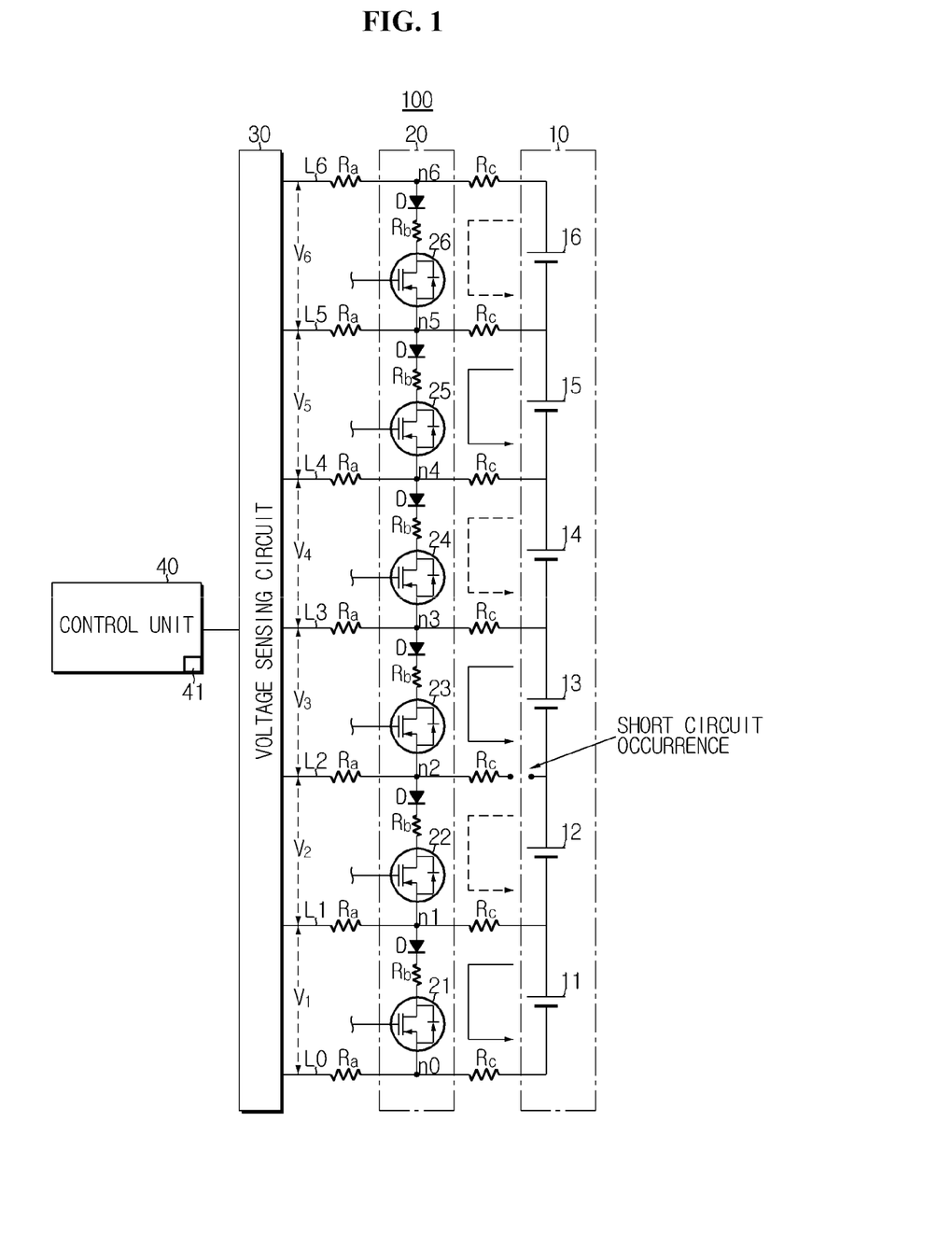
FIG. 1 is a block diagram schematically illustrating construction of an apparatus for diagnosing an abnormality in a cell balancing circuit according to an exemplary embodiment of the present disclosure.

FIG. 1 is a block diagram schematically illustrating construction of an apparatus 100 for diagnosing an abnormality in a cell balancing circuit according to an exemplary embodiment of the present disclosure.

Referring to FIG. 1, the apparatus 100 for diagnosing an abnormality in the cell balancing circuit according to the present disclosure (hereinafter referred to as a 'diagnosis apparatus') is connected to a battery pack 10 including a plurality of secondary battery cells 11~16.

The battery pack 10 includes at least one secondary battery cell 11~16 (hereinafter referred to as a 'cell'), and the cell 11~16 is not limited to a specific type. Each of the cells 11~16 is rechargeable and requires consideration of a charging or discharging voltage, and for example, includes a lithium ion battery, a lithium polymer battery, a Ni—Cd battery, a Ni-MH battery, a Ni—Zn battery, and the like. Also, a number of the cells 11~16 included in the battery pack 10 may be variously set based on a required output voltage or charge capacity. However, the present disclosure is not limited to a type, an output voltage, and a charge capacity of the cell 11~16.

The diagnosis apparatus 100 according to the present disclosure includes a cell balancing circuit 20, a diagnosis resistor Rc, a voltage sensing circuit 30, and a control unit 40.

The cell 11~16 is connected, at both terminals, to a voltage sensing line L0~L6. One end of the voltage sensing line L0~L6 is connected to a terminal of each cell 11~16, and the other end is connected to the voltage sensing circuit 30.

Each of the voltage sensing lines L0~L6 includes each node n0~n6. In the specification, among the nodes n0~n6, a high potential node and a low potential node will be classified based on a high potential terminal and a low potential terminal of a cell. For example, take a look at the node n0 included in the voltage sensing line L0 connected to a low potential terminal of the cell 11 and the node n1 included in the voltage sensing line L1 connected to a high potential terminal of the cell 11. In this instance, the node n0 becomes a low potential node, and the node n1 becomes a high potential node. As another example, let us see the node n1 included in the voltage sensing line L1 connected to a low potential terminal of the cell 12 and the node n2 included in the voltage sensing line L2 connected to a high potential terminal of the cell 12. In this instance, the node n1 becomes a low potential node, and the node n2 becomes a high potential node. As seen from the above two examples, the node n1 may become a high potential node or a low potential node depending on the cell 11 and the cell 12. Accordingly, the nodes n0~n6 are not fixed for a high potential node and a low potential node, and this is relatively determined depending on the cells 11~16.

The cell balancing circuit 20 includes a cell balancing switch 21~26 and a discharge resistor Rb. A number of the cell balancing switches 21~26 and the discharge resistors Rb may vary based on a number of the secondary battery cells 11~16 included in the battery pack 10. The cell balancing switches 21~26 and the discharge resistors Rb are connected between the nodes n0~n6. Accordingly, the cell balancing circuit 20 is connected to the voltage sensing line L0~L6 in parallel.

The diagnosis apparatus 100 according to the present disclosure may further include a diode D connected to the discharge resistor Rb in series between a high potential node and a low potential node on the cell balancing circuit 20 to limit the application of voltage in reverse direction.

The diagnosis resistor Rc is installed on the voltage sensing line L0~L6 at the side of the cell 11~16 with respect to a node (a high potential node and a low potential node) at which the cell balancing circuit 20 and the cell voltage sensing line L0~L6 are connected.

The voltage sensing circuit 30 outputs a voltage corresponding to a voltage difference between the high potential node and the low potential node (hereinafter referred to as an 'inter-node voltage value'). Meanwhile, an inter-node voltage value corresponding to the cell 11 is indicated by 'V1'. Likewise, an inter-node voltage value corresponding to the cell 12 is indicated by 'V2', an inter-node voltage value corresponding to the cell 13 is indicated by 'V3', an inter-node voltage value corresponding to the cell 14 is indicated by 'V4', an inter-node voltage value corresponding to the cell 15 is indicated by 'V5', and an inter-node voltage value corresponding to the cell 16 is indicated by 'V6'. Because a specific construction and an operation principle of the voltage sensing circuit 30 is a general technology widely known in the technical field to which the present disclosure belongs, a detailed description is omitted herein.

The diagnosis apparatus 100 according to the present disclosure may further include an overcurrent protection resistor Ra connected between the node n0~n6 and the voltage sensing circuit 30 to prevent overcurrent from being applied to the voltage sensing circuit 30.

The cell balancing switch 21~26 is turned on and off by a control signal outputted from the control unit 40.

According to an exemplary embodiment of the present disclosure, the cell balancing switches 21~26 are a field effect transistor (FET). In this instance, the control unit 40 controls the turn-on and turn-off of the FET by applying or blocking voltage to a gate terminal of the FET. Accordingly, when the FETs 21~26 are turned on, a source terminal and a drain terminal of the FETs are electrically connected to cause an electric current to flow. In contrast, when the FETs 21~26 are turned off, a source terminal and a drain terminal of the FETs are electrically disconnected to cause a non-flow of electric current.

When the cell balancing switch 21 is turned on, a closed circuit is built, including the cell 11, the diagnosis resistor Rc connected to the node n1, the diode D connected to the node n1, the discharge resistor Rb, the cell balancing switch 21, and the diagnosis resistor Rc connected to the node n0. Accordingly, the inter-node voltage value 'V1' sensed in the voltage sensing circuit 30 is a voltage value applied to the diode D connected to the node n1, the discharge resistor Rb, and the cell balancing switch 21, among the voltage outputted from the cell 11.

In contrast, when cell balancing switch 21 is turned off, the cell 11 constructs an open circuit. Accordingly, an electric current does not flow through the diagnosis resistor Rc connected to the node n1, the overcurrent protection resistor Ra connected to the node n1, the diagnosis resistor Rc connected to the node n0, and the overcurrent protection resistor Ra connected to the node n0. Therefore, the inter-node voltage value 'V1' sensed in the voltage sensing circuit 30 is a voltage value of the cell 11.

When the cell balancing switch 22 is turned on, a closed circuit is built, including the cell 12, the diagnosis resistor Rc connected to the node n2, the diode D connected to the node n2, the discharge resistor Rb, the cell balancing switch 22, and the diagnosis resistor Rc connected to the node n1. Accordingly, the inter-node voltage value 'V2' outputted from the voltage sensing circuit 30 is a voltage value applied to the diode D connected to the node n2, the discharge resistor Rb, and the cell balancing switch 22, among the voltage sensed in the cell 12.

In contrast, when cell balancing switch 22 is turned off, the cell 12 constructs an open circuit. Accordingly, an electric current does not flow through the diagnosis resistor Rc connected to the node n2, the overcurrent protection resistor Ra connected to the node n2, the diagnosis resistor Rc connected to the node n1, and the overcurrent protection resistor Ra connected to the node n1. Therefore, the inter-node voltage value 'V2' sensed in the voltage sensing circuit 30 is a voltage value of the cell 12.

When the cell balancing switch 23 is turned on, a closed circuit is built, including the cell 13, the diagnosis resistor Rc connected to the node n3, the diode D connected to the node n3, the discharge resistor Rb, the cell balancing switch 23, and the diagnosis resistor Rc connected to the node n2. Accordingly, the inter-node voltage value 'V3' sensed in the voltage sensing circuit 30 is a voltage value applied to the diode D connected to the node n3, the discharge resistor Rb, and the cell balancing switch 23, among the voltage outputted from the cell 13.

In contrast, when cell balancing switch 23 is turned off, the cell 13 constructs an open circuit. Accordingly, an electric current does not flow through the diagnosis resistor Rc connected to the node n3, the overcurrent protection resistor Ra connected to the node n3, the diagnosis resistor Rc connected to the node n2, and the overcurrent protection resistor Ra connected to the node n2. Therefore, the inter-node voltage value 'V3' sensed in the voltage sensing circuit 30 is a voltage value of the cell 13.

When the cell balancing switch 24 is turned on, a closed circuit is built, including the cell 14, the diagnosis resistor Rc connected to the node n4, the diode D connected to the node n4, the discharge resistor Rb, the cell balancing switch 24, and the diagnosis resistor Rc connected to the node n3. Accordingly, the inter-node voltage value 'V4' sensed in the voltage sensing circuit 30 is a voltage value applied to the diode D connected to the node n4, the discharge resistor Rb, and the cell balancing switch 24, among the voltage outputted from the cell 14.

In contrast, when cell balancing switch 24 is turned off, the cell 14 constructs an open circuit. Accordingly, an electric current does not flow through the diagnosis resistor Rc connected to the node n4, the overcurrent protection resistor Ra connected to the node n4, the diagnosis resistor Rc connected to the node n3, and the overcurrent protection resistor Ra connected to the node n3. Therefore, the inter-node voltage value 'V4' sensed in the voltage sensing circuit 30 is a voltage value of the cell 14.

When the cell balancing switch 25 is turned on, a closed circuit is built, including the cell 15, the diagnosis resistor Rc connected to the node n5, the diode D connected to the node n5, the discharge resistor Rb, the cell balancing switch 25, and the diagnosis resistor Rc connected to the node n4. Accordingly, the inter-node voltage value 'V5' sensed in the voltage sensing circuit 30 is a voltage value applied to the diode D connected to the node n5, the discharge resistor Rb, and the cell balancing switch 25, among the voltage outputted from the cell 15.

In contrast, when cell balancing switch 25 is turned off, the cell 15 constructs an open circuit. Accordingly, an electric current does not flow through the diagnosis resistor Rc connected to the node n5, the overcurrent protection resistor Ra connected to the node n5, the diagnosis resistor Rc connected to the node n4, and the overcurrent protection resistor Ra connected to the node n4. Therefore, the inter-node voltage value 'V5' sensed in the voltage sensing circuit 30 is a voltage value of the cell 15.

When the cell balancing switch 26 is turned on, a closed circuit is built, including the cell 16, the diagnosis resistor Rc connected to the node n6, the diode D connected to the node n6, the discharge resistor Rb, the cell balancing switch 26, and the diagnosis resistor Rc connected to the node n5. Accordingly, the inter-node voltage value 'V6' sensed in the voltage sensing circuit 30 is a voltage value applied to the diode D connected to the node n6, the discharge resistor Rb, and the cell balancing switch 26, among the voltage outputted from the cell 16.

In contrast, when cell balancing switch 26 is turned off, the cell 16 constructs an open circuit. Accordingly, an electric current does not flow through the diagnosis resistor Rc connected to the node n6, the overcurrent protection resistor Ra connected to the node n6, the diagnosis resistor Rc connected to the node n5, and the overcurrent protection resistor Ra connected to the node n5. Therefore, the inter-node voltage value 'V6' sensed in the voltage sensing circuit 30 is a voltage value of the cell 16.

In the specification, the inter-node voltage values 'V1~V6' sensed in the voltage sensing circuit 30 when the cell balancing switches 21~26 are turned off is referred to as a 'cell voltage value'.

The control unit 40 classifies circuits to be diagnosed among the cell balancing circuit 20 into at least two groups according to an order in which each cell is connected within the battery pack. The classification criteria may be variously preset.

According to an exemplary embodiment of the present disclosure, the control unit 40 divides into an odd group and an even group according to a location at which each of the cells 11~16 is connected from a low potential terminal of the battery pack 10. Accordingly, a cell balancing circuit including the cell balancing switches 21, 23, and 25 connected to the cells 11, 13, and 15 is an odd group, and a cell balancing circuit including the cell balancing switches 22, 24, and 26 connected to the cells 12, 14, and 16 is an even group.

The control unit 40 outputs a signal for controlling the turn-on and turn-off of the cell balancing switches 21~26. In this instance, the control unit 40 classifies a target cell balancing circuit to be diagnosed and a non-target cell balancing circuit among circuits included in the cell balancing circuit, and outputs a signal for controlling the turn-on and turn-off of the cell balancing switches 21~26.

For example, the control unit 40 outputs a control signal to turn on the cell balancing switches 21, 23, and 25 connected to the odd group, that is, the cells 11, 13, and 15, and outputs a control signal to turn off the cell balancing switches 22, 24, and 26 connected to the even group, that is, the cells 12, 14, and 16, in order to inspect a portion of the cell balancing circuit including the cell balancing switches 21, 23, and 25 among the cell balancing circuit 20.

In contrast, the control unit 40 outputs a control signal to turn off the cell balancing switches 21, 23, and 25 connected to the odd group, that is, the cells 11, 13, and 15, and outputs a control signal to turn on the cell balancing switch 22, 24, and 26 connected to the even group, that is, the cells 12, 14, and 16, in order to inspect a portion of the cell balancing circuit including the cell balancing switches 22, 24, and 26 among the cell balancing circuit 20.

In the specification, when the cell balancing switches 21, 23, and 25 (on the other hand, 22, 24, and 26) of the cell balancing circuit to be diagnosed are turned on in a turn-off state of the cell balancing switches 22, 24, and 26 (on the other hand, 21, 23, and 25) included in the cell balancing circuit adjacent to the cell balancing switches 21, 23, and 25 (on the other hand, 22, 24, and 26) included in the cell balancing circuit to be diagnosed among the cell balancing circuit 20, the inter-node voltage values 'V1~V6' outputted from the voltage sensing circuit 30 are referred to as a 'diagnosis voltage value'.

The diagnosis apparatus 100 according to the present disclosure may include a memory unit 41. The memory unit 41 may be disposed inside or outside the control unit 40, and may be connected to the control unit 40 by various known means. The memory unit corresponds to a high-capacity storage medium such as a semiconductor device or a hard disk that is known as being capable of recording and erasing data, for example, random access memory (RAM), read-only memory (ROM), electrical erasable programmable read-only memory (EEPROM), and the like, and encompasses any device capable of storing information regardless of a device type and is not limited to a specific memory device.

To execute computation and various control logics as specified below, the control unit 40 may include a processor, an application-specific integrated circuit (ASIC), a chipset, a logic circuit, a register, a communication modem, and a data processing device, well known in the technical field to which the present disclosure belongs. Also, when a control logic as described below is implemented in software, the control unit 40 may be implemented as an assembly of program modules. In this instance, the program module may be stored in the memory unit 41 and executed by a processor.

Hereinafter, a method for diagnosing an abnormality in a cell balancing circuit according to an exemplary embodiment of the present disclosure will be described. However, each component and an overlapping description of the diagnosis apparatus 100 specified above are omitted herein. Also, for convenience of understanding, the cells 11~16 included in the battery pack 10 will be described based on an embodiment in which the cells 11~16 included in the battery pack 10 are classified into the odd group cell 11, 13, and 15 and the even group cell 12, 14, and 16.

Figure 2:
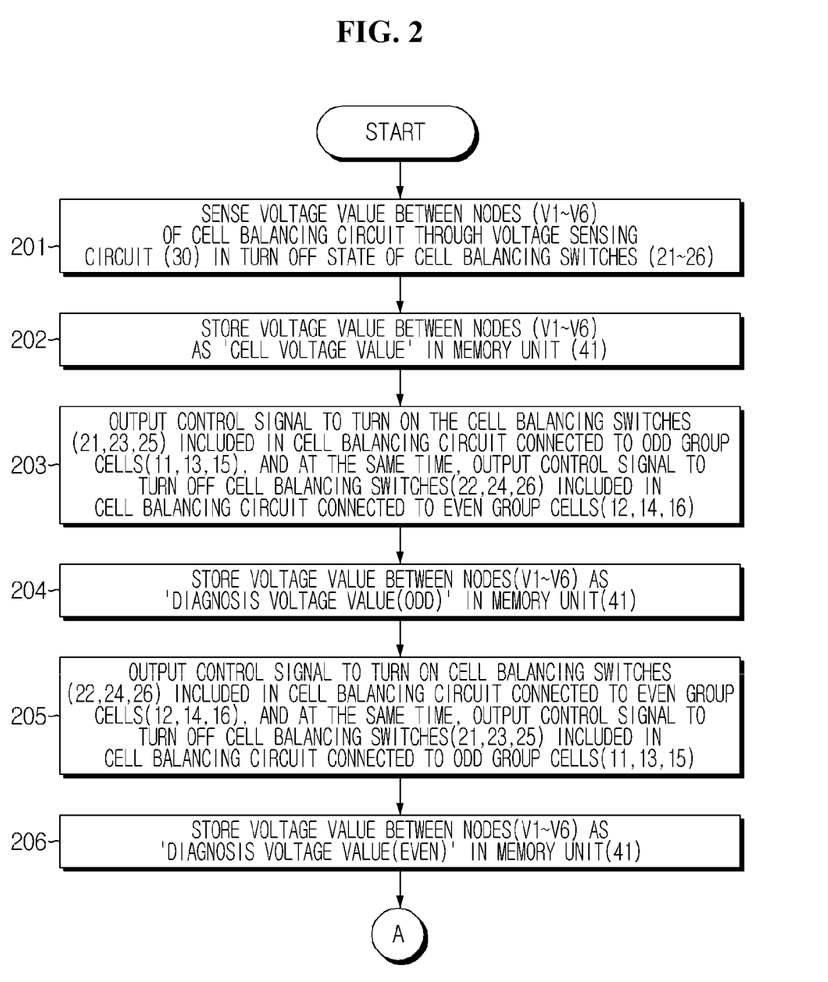
FIGS. 2 and 3 are flowcharts illustrating a method for diagnosing an abnormality in a cell balancing circuit according to an exemplary embodiment of the present disclosure.
Figure 3:
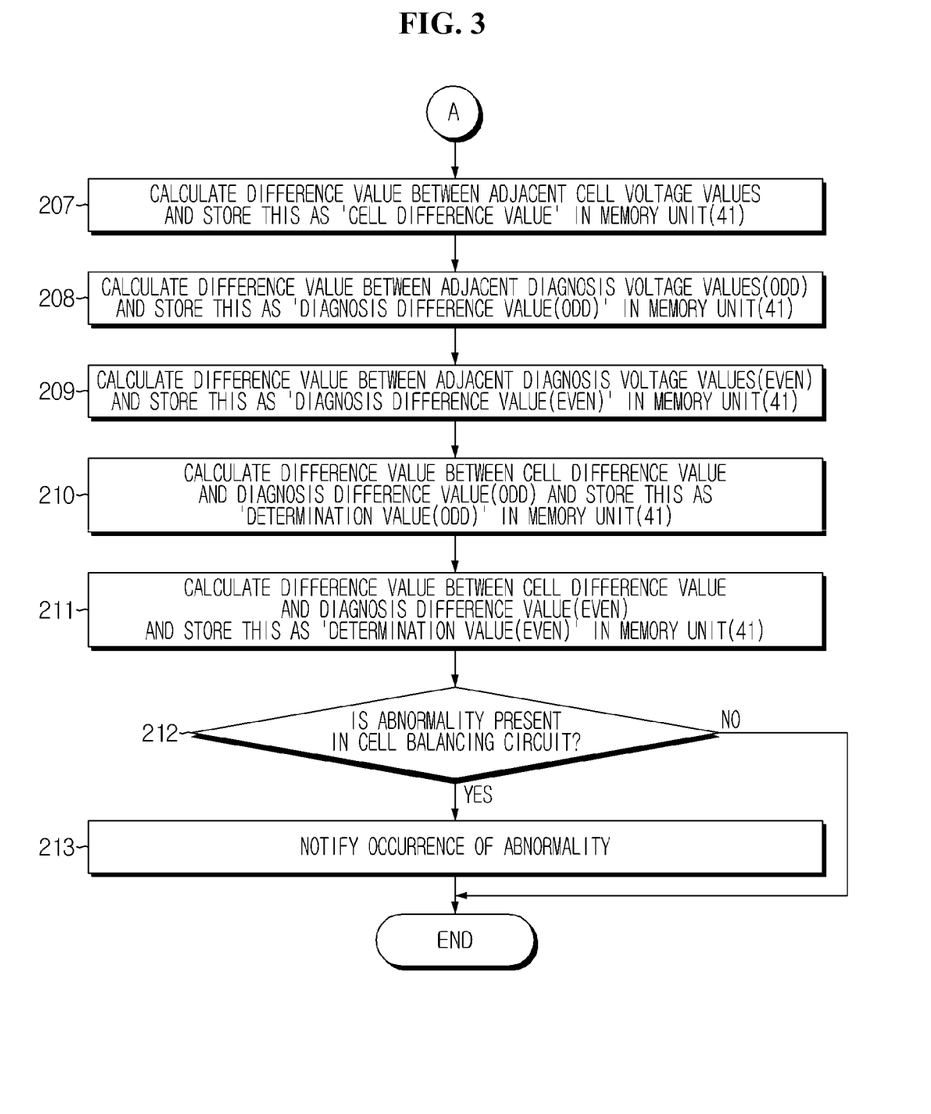

FIGS. 2 and 3 are flowcharts illustrating a method for diagnosing an abnormality in a cell balancing circuit according to an exemplary embodiment of the present disclosure.

First, in step 201, the control unit 40 controls the cell balancing switches 21~26 into a turn-off state. Also, the control unit 40 senses the inter-node voltage values V1~V6 of the cell balancing circuit through the voltage sensing circuit 30.

The control unit 40 completes the process of step 201 and goes to step 202.

In step 202, the control unit 40 stores the inter-node voltage values V1~V6 as a 'cell voltage value' in the memory unit 41. The control unit 40 completes the process of step 202 and goes to step 203.

In step 203, the control unit 40 outputs a control signal to turn on the cell balancing switches 21, 23, and 25 included in the cell balancing circuit connected to the odd group cells 11, 13, and 15. At the same time, the control unit 40 outputs a control signal to turn off the cell balancing switches 22, 24, and 26 included in the cell balancing circuit connected to the even group cells 12, 14, and 16. The control unit 40 completes the process of step 203 and goes to step 204.

In step 204, the control unit 40 stores the inter-node voltage values V1~V6 as a 'diagnosis voltage value (odd)' in the memory unit 41. The control unit 40 completes the process of step 204 and goes to step 205.

In step 205, the control unit 40 outputs a control signal to turn on the cell balancing switches 22, 24, and 26 included in the cell balancing circuit connected to the even group cells 12, 14, and 16. At the same time, the control unit 40 outputs a control signal to turn off the cell balancing switches 21, 23, and 25 included in the cell balancing circuit connected to the odd group cells 11, 13, and 15. The control unit 40 completes the process of step 205 and goes to step 206.

In step 206, the control unit 40 stores the inter-node voltage values V1~V6 as a 'diagnosis voltage value (even)' in the memory unit 41. The control unit 40 completes the process of step 206 and goes to step 207.

In step 207, the control unit 40 calculates a difference value between adjacent cell voltage values, and stores this as a 'cell difference value' in the memory unit 41. The control unit 40 completes the process of step 207 and goes to step 208.

In step 208, the control unit 40 calculates a difference value between adjacent 'diagnosis voltage values (odd)', and stores this as a 'diagnosis difference value (odd)' in the memory unit 41. The control unit 40 completes the process of step 208 and goes to step 209.

In step 209, the control unit 40 calculates a difference value between adjacent 'diagnosis voltage values (even)', and stores this as a 'diagnosis difference value (even)' in the memory unit 41. The control unit 40 completes the process of step 209 and goes to step 210.

In step 210, the control unit 40 calculates a difference value between the cell difference value and the diagnosis difference value (odd), and stores this as a 'determination value (odd)' in the memory unit 41. The control unit 40 completes the process of step 210 and goes to step 211.

In step 211, the control unit 40 calculates a difference value between the cell difference value and the diagnosis difference value (even), and stores this as a 'determination value (even)' in the memory unit 41. The control unit 40 completes the process of step 211 and goes to step 212.

In step 212, the control unit 40 determines whether an abnormality is present in the cell balancing circuit by analyzing change patterns of the determination value (odd) and the determination value (even).

According to an exemplary embodiment, the control unit 40 may determine that an abnormality is present in the cell balancing circuit 20 corresponding to a determination value of which a level is found to reduce when comparing to an adjacent determination value.

Specifically, among the determination values (odd), the determination values corresponding to the odd group cell 11, 13, and 15 are compared to one another. In this instance, when any one determination value reduces in level in comparison to the other determination values, an abnormality or wiring error is determined to occur in (any one of) the cell balancing switches 21, 23, and 25 of the cell balancing circuit 20 corresponding to the corresponding determination value. Similarly, among the determination values (even), the determination values corresponding to the even group cell 12, 14, and 16 are compared to one another. In this instance, when any one determination value reduces in level in comparison to the other determination values, an abnormality or wiring error is determined to occur in (any one of) the cell balancing switches 22, 24, and 26 of the cell balancing circuit 20 corresponding to the corresponding determination value.

According to another embodiment, when a change amount is greater than a preset reference change value by comparing adjacent determination values, an abnormality is determined to be present in a corresponding cell balancing circuit.

The reference change value may be variously set in consideration of characteristics of the secondary battery cells 11~46. Also, the preset reference change value may be stored in the memory unit 41 before step 201.

Specifically, among the determination values (odd), the determination values corresponding to the odd group cells 11, 13, and 15 are compared to one another. In this instance, determination is made as to whether an extent to which any one determination value reduces in level is greater than or equal to the reference change value in comparison to the other determination values. When the level reduction extent of the determination value is greater than or equal to the reference change value, an abnormality or wiring error is determined to occur in (any one of) the cell balancing switches 21, 23, and 25 of the cell balancing circuit 20 corresponding to the corresponding determination value. Similarly, among the determination values (even), the determination values corresponding to the odd group cells 12, 14, and 16 are compared to one another. In this instance, determination is made as to whether an extent to which any one determination value reduces in level is greater than or equal to the reference change value in comparison to the other determination values. When the level reduction extent of the determination value is greater than or equal to the reference change value, an abnormality or wiring error is determined to occur in (any one of) the cell balancing switches 22, 24, and 26 of the cell balancing circuit 20 corresponding to the corresponding determination value. In the case of the above embodiment, the problem may be solved with incorrect determination of an abnormality determined to have occurred on the basis of a measurement result that the 'diagnosis voltage value' corresponding to the secondary battery cell 11 located at a lowest potential terminal of the battery pack 10 or the secondary battery cell 16 located at a highest potential terminal was lower than those of the other secondary battery cells 12, 13, 14, and 15 located in the battery pack 10.

The apparatus and method for diagnosing an abnormality in a cell balancing circuit according to the present disclosure may determine whether an abnormality has occurred more correctly than a conventional abnormality diagnosis apparatus and method. Particularly, when controlling a cell balancing switch, a little time difference may occur. In this case, a voltage change may occur in a cell included in a battery pack, and despite this change, whether an abnormality has occurred may be determined correctly through a difference value of a diagnosis value, and a determination value.

Hereinafter, the effects of the present disclosure will be described through specific examples.

FIGS. 4 through 9 are tables showing specific exemplary values of a cell voltage value and a diagnosis voltage value. In this embodiment, it is assumed that an abnormality occurred due to a short in the voltage sensing line L2 of the circuit shown in FIG. 1.

Figure 4:
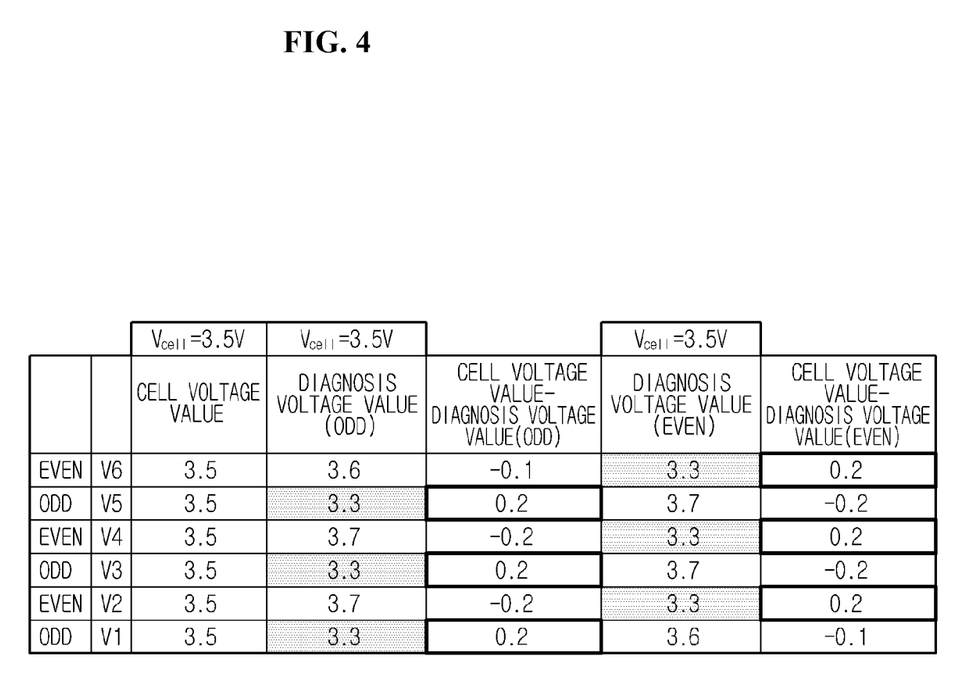
FIGS. 4 through 9 are tables showing specific exemplary values of a cell voltage value and a diagnosis voltage value.
Figure 5:
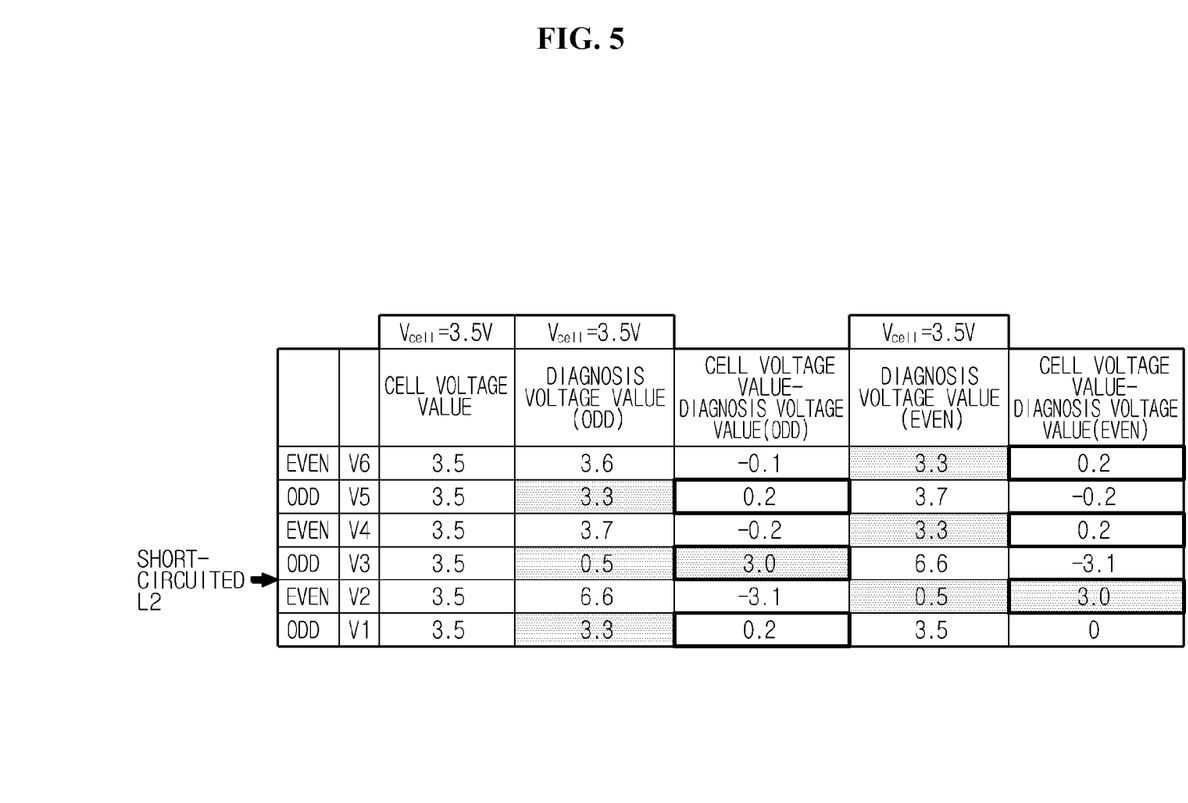

FIGS. 4 and 5 illustrate a case in which determination is made as to whether an abnormality has occurred simply using a difference value between a cell voltage value and a diagnosis voltage value, without following the present disclosure.

First, FIG. 4 illustrates a case in which an abnormality did not occur. In this instance, measured cell voltage values are 3.5V, diagnosis voltage values (odd) are 3.3V, and diagnosis voltage values (even) are 3.3V. Accordingly, a difference value between the cell voltage value and the diagnosis voltage value (odd) is all 0.2V, and a difference value between the cell voltage value and the diagnosis voltage value (even) is all 0.2V. Accordingly, because all the difference values are equal, it is determined that no abnormality occurred.

Next, FIG. 5 illustrates a case in which an abnormality occurred. In this instance, it can be seen that among diagnosis voltage values (odd), only V3 has changed to 0.5V, and among diagnosis voltage values (even), only V2 has changed to 0.5V. Accordingly, all difference values between cell voltage values and diagnosis voltage values (odd, even) corresponding to V1, V4, V5, and V6 are 0.2V, but difference values between cell voltage values and diagnosis voltage values corresponding to V2 and V3 are 3.0V. Accordingly, it may be determined that an abnormality occurred in the voltage sensing line L2 corresponding to V2 and V3.

Figure 6:
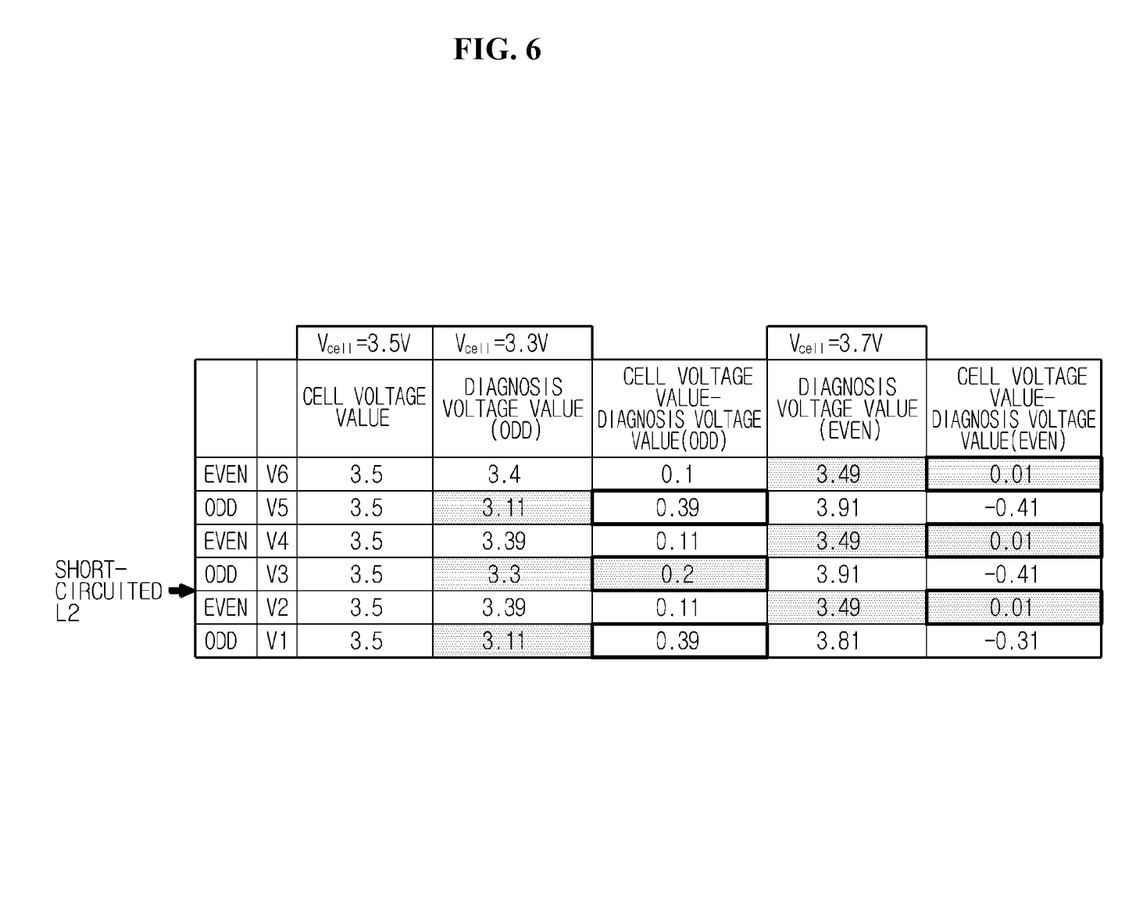

However, the method shown in FIGS. 4 and 5 (different from the method of the present disclosure) is on the premise that voltages of all the cells 11~16 included in the battery pack 10 are equal, and at the same time, cell voltage values are all equal when the cell balancing switches 21, 23, and 25 corresponding to an odd group are turned on and when the cell balancing switches 22, 24, and 26 corresponding to an even group are turned on. Accordingly, if the above condition is not a little bit satisfied, accuracy in abnormality determination is lowered. FIG. 6 below is an example in which an abnormality situation is incorrectly determined when the above condition is not satisfied.

FIG. 6 illustrates a case in which an abnormality occurred but a cell voltage value has changed when the cell balancing switches 21, 23, and 25 corresponding to an odd group were turned on and when the cell balancing switches 22, 24, and 26 corresponding to an even group were turned on. Specifically, when the cell balancing switches 21, 23, and 25 corresponding to an odd group were turned on, a cell voltage has changed to 3.3V lower by 0.2V. Also, when the cell balancing switches 22, 24, and 26 corresponding to an even group were turned on, a cell voltage has changed to 3.7V higher by 0.2V.

As a result, among diagnosis voltage values (odd), a diagnosis voltage value corresponding to V3 was measured as 3.3V. Thus, a difference value between the cell voltage value and the diagnosis voltage value (corresponding to V3) is 0.2V. This value is the same difference value as a difference value between a cell voltage value and a diagnosis voltage value (odd) calculated in the case of FIG. 4, that is, in the case where an abnormality did not occur. Accordingly, even though an abnormality occurred, determination may be made as a normal situation.

Further, it can be seen that all diagnosis voltage values (even) are measured as 3.49V. Thus, a difference between a cell voltage value and a diagnosis voltage value (even) is 0.01V. This value is a value of a lower level than a difference value between a cell voltage value and a diagnosis voltage (even) calculated in the case of FIG. 4, that is, in the case where an abnormality did not occur. Accordingly, even though an abnormality occurred only in the voltage sensing line L2, it may be incorrectly determined that an abnormality has occurred in all the cell balancing circuits corresponding to V2, V4, and V6.

In contrast, the apparatus 100 and method for diagnosing an abnormality in a cell balancing circuit according to the present disclosure may correctly determine whether an abnormality occurred, even though cell voltage values are different, when a cell voltage value has changed when the cell balancing switches 21, 23, and 25 corresponding to an odd group were turned on and when a cell voltage value has changed when the cell balancing switches 22, 24, and 26 corresponding to an even group were turned on.

Figure 7:
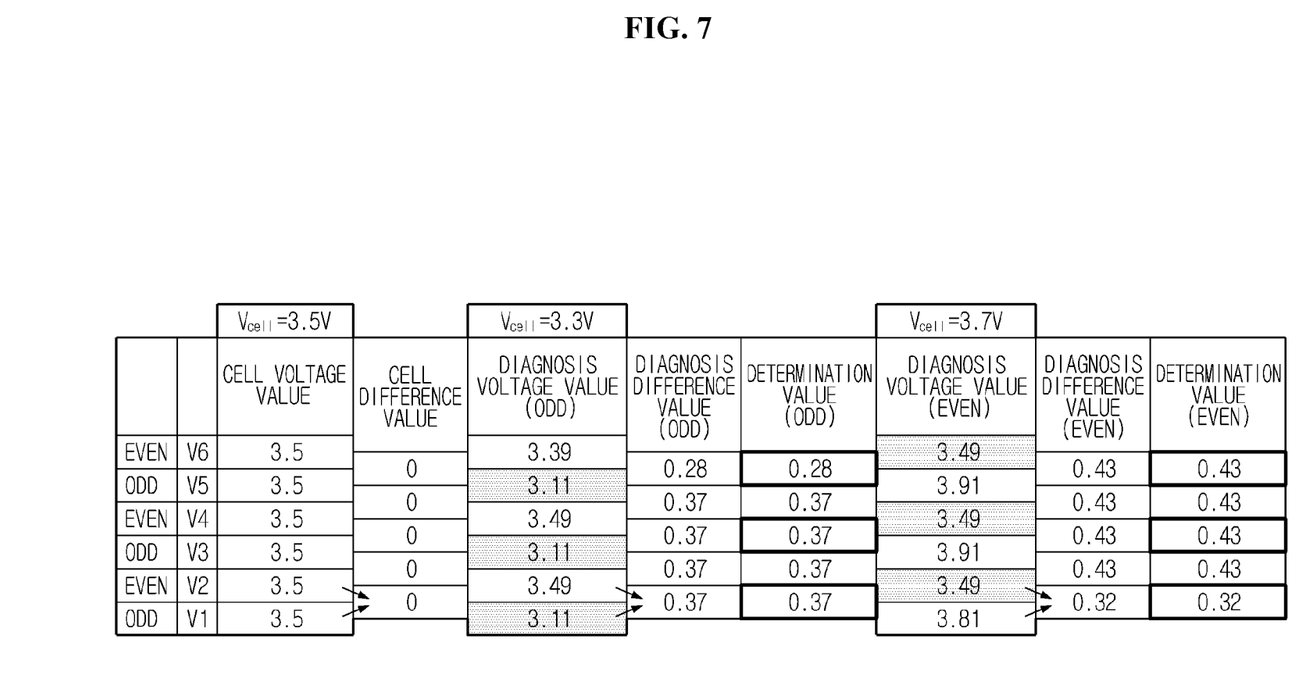
Figure 9:
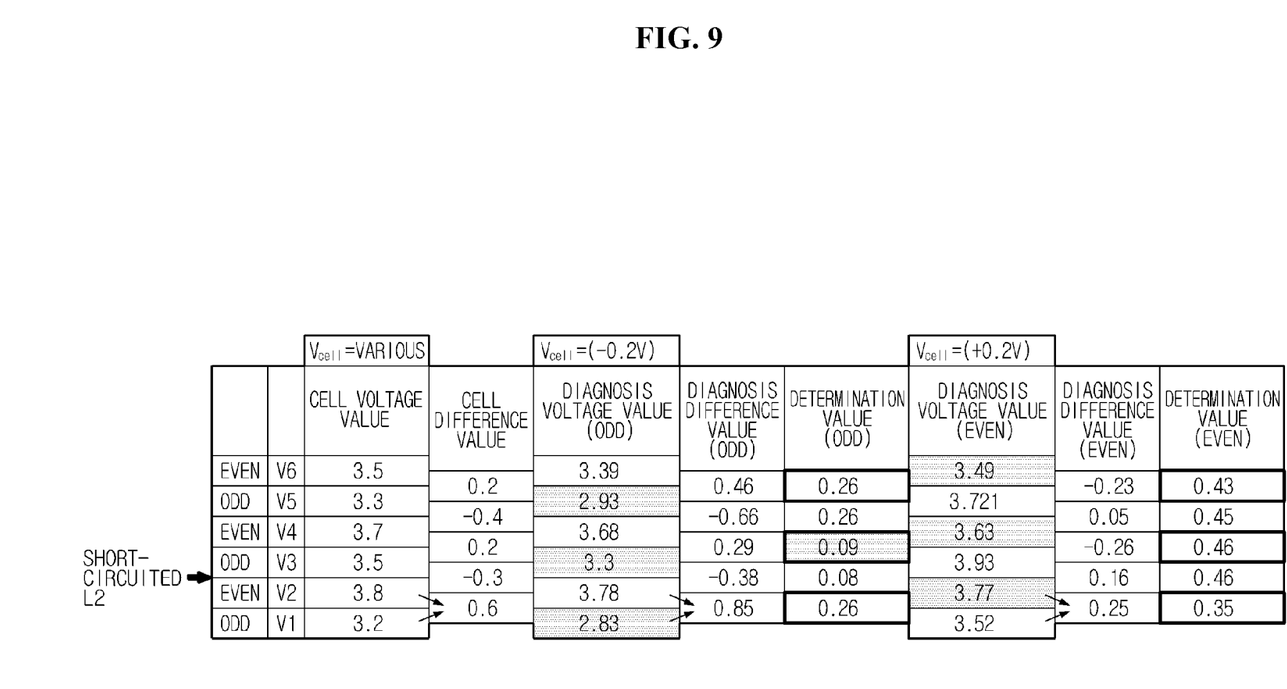

Hereinafter, FIGS. 7 and 9 illustrate that determination is made as to whether an abnormality occurred according to the present disclosure.

FIG. 7 shows a case in which an abnormality did not occur, but a cell voltage value has changed when the cell balancing switches 21, 23, and 25 corresponding to an odd group were turned on and when the cell balancing switches 22, 24, and 26 corresponding to an even group were turned on. Specifically, when the cell balancing switches 21, 23, and 25 corresponding to an odd group were turned on, a cell voltage value has decreased to 3.3V by 0.2V. Also, when the cell balancing switches 22, 24, and 26 corresponding to an even group were turned on, a cell voltage value has increased to 3.7V by 0.2V.

In the embodiment of FIG. 7, it can be seen that cell difference values, diagnosis difference values (odd), diagnosis difference values (even), determination values (odd), and determination values (even) are calculated according to the embodiments of the present disclosure. Particularly, seeing the determination values (odd) and the determination values (even), it can be seen that there is no difference in value. However, the determination value corresponding to V5 among the determination values (odd) and the determination value corresponding to V2 among the determination values (even) are a little small value due to characteristics associated with the voltage values of the cells 11 and 16 located at the outermost part in the battery pack 10. This difference is a natural result, and thus, the control unit 40 according to the present disclosure determines that an abnormality did not occur.

Figure 8:
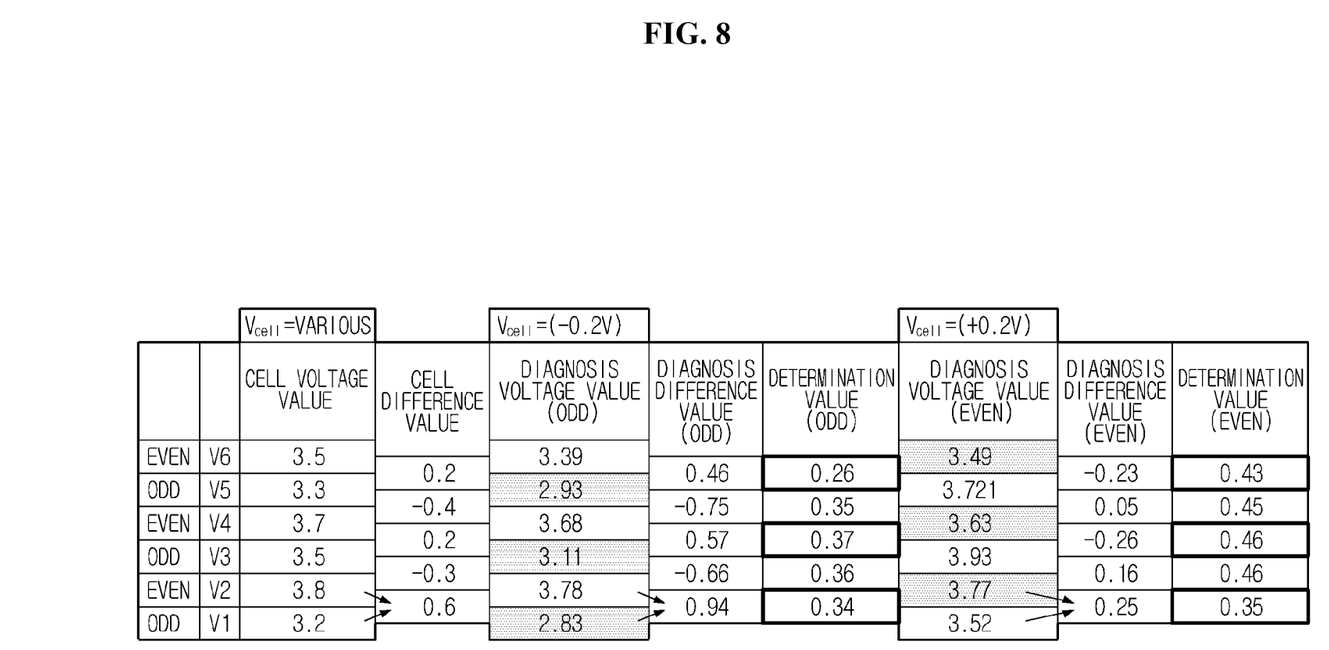

FIG. 8 shows a case in which cell voltage values are various, further to the case of FIG. 7. That is, an abnormality did not occur and the cells 11~16 included in the battery pack 10 had different voltage values. Likewise, when the cell balancing switches 21, 23, and 25 corresponding to an odd group were turned on, a cell voltage value has decreased to 3.3V by 0.2V. Also, when the cell balancing switches 22, 24, and 26 corresponding to an even group were turned on, a cell voltage value has increased to 3.7V by 0.2V.

In the embodiment of FIG. 8, it can also be seen that cell difference values, diagnosis difference values (odd), diagnosis difference values (even), determination values (odd), and determination values (even) are calculated according to the embodiments of the present disclosure. Particularly, seeing the determination values (odd) and the determination values (even), it can be seen that a difference did not occur in the determination values (odd) and the determination values (even) although the cell voltage values are various. However, the determination value corresponding to V5 among the determination values (odd) and the determination value corresponding to V2 among the determination values (even) are a little small value due to characteristics associated with the voltage values of the cells 11 and 16 located at the outermost part of the battery pack 10. This difference is a natural result, and thus, the control unit 40 according to the present disclosure determines that an abnormality did not occur.

Finally, let us see the embodiment of FIG. 9. FIG. 9 shows a situation in which an abnormality occurred due to a short in the voltage sensing line L2 in FIG. 8.

In the embodiment of FIG. 9, it can also be seen that cell difference values, diagnosis difference values (odd), diagnosis difference values (even), determination values (odd), and determination values (even) are calculated according to the embodiments of the present disclosure. Particularly, seeing V3 among the determination values (odd), it can be seen that the determination value corresponding to V3 is a much smaller value than the other determination values. Accordingly, the control unit 40 according to the present disclosure determines that an abnormality has occurred in the cell balancing circuit 20.

The above-described process of diagnosing an abnormality in a cell balancing circuit according to the present disclosure may be performed periodically, or may be performed temporarily when abnormality diagnosis is requested from the external.

Meanwhile, the apparatus for diagnosing an abnormality in a cell balancing circuit according to the present invention may further include an abnormality alarm (not shown) to notify, when an abnormality occurs in the cell balancing circuit, the occurrence of the abnormality and the cause of the abnormality to the external. When the control unit 40 determines that there is an abnormality in the cell balancing switch, the control unit 40 may transmit an abnormality occurrence signal to the abnormality alarm through which the occurrence of the abnormality and the cause of the abnormality are visually or audibly notified to the external.

The abnormality alarm includes a liquid emitting display (LED), a liquid crystal display (LCD), an alarm, or combinations thereof. In this case, when an abnormality occurrence signal is inputted, the abnormality alarm may notify occurrence of an abnormality in the cell balancing circuit and the cause of the abnormality to a user, by flashing an LED or outputting an alarm message on an LCD or by generating an alarm buzz. The LED, LCD, and alarm are just an example of the abnormality alarm, and it is obvious to an ordinary person skilled in the art that a visual or audio alarm in various forms of modifications may be employed as the abnormality alarm.

The apparatus 100 for diagnosing an abnormality in a cell balancing circuit according to the present disclosure may be one component of a battery pack including a plurality of secondary battery cells connected in series. In this case, the control unit 40 may be included in a battery management system (BMS) that controls the charge and discharge of the battery pack. The BMS may perform various control functions that can be applied at the level of an ordinary skill in the art, including measurement of an electrical characteristic value including voltage or current of each secondary battery cell, charge/discharge control, voltage equalization control, state of charge (SOC) estimation, and the like.

The battery pack according to the present disclosure may be one component of a battery operating system including the battery pack and a load that is supplied with power form the battery pack.

The battery operating system may be, for example, an electric vehicle (EV), a hybrid electric vehicle (HEV), an electric bike, a power tool, an energy storage system, an uninterruptible power supply (UPS), a portable computer, a mobile phone, a portable audio player, or a portable video player, and the load may be, for example, a motor that provides a rotational force by power supplied from the battery pack, or an energy conversion circuit that converts power supplied from the battery pack to power required for various circuit components.

Meanwhile, in the description of the present disclosure, it should be understood that each element of the apparatus for diagnosing an abnormality in a cell balancing circuit according to the present disclosure as shown in FIG. 1 is distinguished logically rather than physically.

That is, each element corresponds to a logic element to realize the technical spirit of the present disclosure, and accordingly, even though each element is integrated or separated, it should be construed as falling within the scope of the present disclosure if a function performed by a logic element of the present disclosure can be implemented, and it should be understood that it falls within the scope of the present disclosure regardless of whether names are identical or not if it is an element performing an identical or similar function.

Hereinabove, the present disclosure has been described by specific embodiments and drawings, but the present disclosure is not limited thereto and it should be understood that various changes and modifications may be made by an ordinary person skilled in the art within the spirit and scope of the disclosure and the appended claims and their equivalents.

What is claimed is:

1. An apparatus for diagnosing an abnormality in a cell balancing circuit in a battery pack including a plurality of cells corresponding to each cell balancing circuit, the apparatus comprising:
    a cell balancing circuit connected in parallel to a voltage sensing line connected to both terminals of each cell, and including a cell balancing switch and a discharge resistor;
    a diagnosis resistor installed on the voltage sensing line at the side of the cell with respect to a node (a high potential node and a low potential node) at which the cell balancing circuit and the cell voltage sensing line are connected;
    a voltage sensing circuit to output a voltage corresponding to a voltage difference between the high potential node and the low potential node (hereinafter referred to as an 'inter-node voltage value); and
    a control unit to store an inter-node voltage value (hereinafter referred to as a cell voltage value) in a turn-off state of the cell balancing switches and an inter-node voltage value (hereinafter referred to as a diagnosis voltage value) by turning on a cell balancing switch of a cell balancing circuit to be diagnosed among the cell balancing circuits in a turn-off state of a cell balancing switch included in a cell balancing circuit adjacent to the cell balancing circuit to be diagnosed, to calculate a difference value between adjacent cell voltage values (hereinafter referred to as a cell difference value) and a difference value between adjacent diagnosis voltage values (hereinafter referred to as a diagnosis difference value), and to determine whether an abnormality is present in the cell balancing circuit by analyzing a change pattern of a difference value between the cell difference value and the diagnosis difference value (hereinafter referred to as a determination value).

2. The apparatus for diagnosing an abnormality in a cell balancing circuit according to claim 1, further comprising:
    a diode connected to the discharge resistor in series between the high potential node and the low potential node on the cell balancing circuit to limit the application of voltage in reverse direction.

3. The apparatus for diagnosing an abnormality in a cell balancing circuit according to claim 1, wherein the cell balancing switch is a field effect transistor (FET).

4. The apparatus for diagnosing an abnormality in a cell balancing circuit according to claim 1, wherein the control unit classifies the cell balancing circuits into at least two groups according to a location at which each cell is connected within the battery pack.

5. The apparatus for diagnosing an abnormality in a cell balancing circuit according to claim 4, wherein the control unit divides into an odd group and an even group according to a location at which each cell is connected from the low potential terminal of the battery pack.

6. The apparatus for diagnosing an abnormality in a cell balancing circuit according to claim 1, wherein the control unit calculates an absolute value of the determination value, and determines that an abnormality is present in a cell balancing circuit corresponding to a determination value of which a level reduces, by comparing to an adjacent determination value.

7. The apparatus for diagnosing an abnormality in a cell balancing circuit according to claim 1, wherein the control unit calculates an absolute value of the determination value, and determines that an abnormality is present in a cell balancing circuit corresponding to a change amount greater than a preset reference change value, by comparing to an adjacent determination value.

8. The apparatus for diagnosing an abnormality in a cell balancing circuit according to claim 7, further comprising:
    a memory unit to store the reference change value.

9. The apparatus for diagnosing an abnormality in a cell balancing circuit according to claim 1, further comprising:
    an abnormality alarm to notify, when an abnormality occurs in the cell balancing circuit, the occurrence of the abnormality to an external,
    wherein the control unit notifies the occurrence of the abnormality in the cell balancing circuit visually or audibly through the abnormality alarm.

10. A battery pack comprising:
    an apparatus for diagnosing an abnormality in a cell balancing circuit defined in claim 1; and
    a plurality of secondary battery cells connected in series.

11. A battery operating system comprising:
    a battery pack defined in claim 10; and
    a load that is supplied with power from the battery pack.

12. The battery operating system according to claim 11, wherein the load is an electricity-powered means or a portable device.

13. A method for diagnosing an abnormality in a cell balancing circuit in a battery pack including a plurality of cells, using a cell balancing circuit connected in parallel to a voltage sensing line connected to both terminals of each cell and including a cell balancing switch and a discharge resistor corresponding to each cell, a diagnosis resistor installed on the voltage sensing line at the side of the cell with respect to a node (a high potential node and a low potential node) at which the cell balancing circuit and the cell voltage sensing line are connected, and a voltage sensing circuit to output a voltage corresponding to a voltage difference between the nodes of the cell, the method comprising:
    (a) sensing a voltage value between the nodes of the cell balancing circuit through the voltage sensing circuit in a turn-off state of the cell bala
    (b) sensing a voltage value between the nodes of the cell (hereinafter referred to as a 'diagnosis voltage value) by turning on a cell balancing switch of a cell balancing circuit to be diagnosed among the cell balancing circuits in a turn-off state of a cell balancing switch included in a cell balancing circuit adjacent to the cell balancing circuit to be diagnosed; and
    (c) calculating a difference value between adjacent cell voltage values (hereinafter referred to as a 'cell difference value') and a difference value between adjacent diagnosis voltage values (hereinafter referred to as a diagnosis difference value), and determining whether an abnormality is present in the cell balancing circuit by analyzing a change pattern of a difference value between the cell difference value and
the diagnosis difference value (hereinafter referred to as a determination value).

14. The method for diagnosing an abnormality in a cell balancing circuit according to claim 13, wherein in the step (b), the circuits to be diagnosed are classified into at least two groups according to a location at which each cell is connected within the battery pack.

15. The method for diagnosing an abnormality in a cell balancing circuit according to claim 14, wherein in the step (b), the circuits to be diagnosed are divided into an odd group and an even group according to a location at which each cell is connected from the low potential terminal of the battery pack.

16. The method for diagnosing an abnormality in a cell balancing circuit according to claim 13, wherein the step (c) comprises calculating an absolute value of the determination value, and determining that an abnormality is present in a cell balancing circuit corresponding to a determination value of which a level reduces, by comparing to an adjacent determination value.

17. The method for diagnosing an abnormality in a cell balancing circuit according to claim 13, wherein the step (c) comprises calculating an absolute value of the determination value, and determining that an abnormality is present in a cell balancing circuit corresponding to a change amount greater than a preset reference change value, by comparing to an adjacent determination value.

18. The method for diagnosing an abnormality in a cell balancing circuit according to claim 17, further comprising:
before the step (a), storing the reference change value.

19. The method for diagnosing an abnormality in a cell balancing circuit according to claim 13, further comprising:
(d) notifying, when an abnormality occurs in the cell balancing circuit, the occurrence of the abnormality visually or audibly to an external.

* * * * *